United States Patent
Horsley et al.

(10) Patent No.: US 10,683,231 B2
(45) Date of Patent: Jun. 16, 2020

(54) GLASSES

(71) Applicant: PILKINGTON GROUP LIMITED, Lathom (GB)

(72) Inventors: Martin James Horsley, Helsby (GB); Shona Taylor, Lathom (GB)

(73) Assignee: Pilkington Group Limited, Lathom (GB)

( * ) Notice: Subject to any disclaimer, the term of this patent is extended or adjusted under 35 U.S.C. 154(b) by 0 days.

(21) Appl. No.: 15/561,261

(22) PCT Filed: Mar. 23, 2016

(86) PCT No.: PCT/GB2016/050812
§ 371 (c)(1),
(2) Date: Sep. 25, 2017

(87) PCT Pub. No.: WO2016/151322
PCT Pub. Date: Sep. 29, 2016

(65) Prior Publication Data
US 2018/0118607 A1    May 3, 2018

(30) Foreign Application Priority Data

Mar. 26, 2015 (GB) .................................. 1505091.7

(51) Int. Cl.
*C03C 3/087* (2006.01)
*H01L 31/0392* (2006.01)

(52) U.S. Cl.
CPC ........ *C03C 3/087* (2013.01); *H01L 31/03923* (2013.01); *H01L 31/03925* (2013.01); *Y02E 10/541* (2013.01)

(58) Field of Classification Search
CPC ............... C03C 3/087; H01L 31/03923; H01L 31/03925
See application file for complete search history.

(56) References Cited

U.S. PATENT DOCUMENTS

| | | |
|---|---|---|
| 3,753,674 A | 8/1973 | Ohlberg |
| 4,792,536 A | 12/1988 | Pecoraro |
| 5,071,796 A | 12/1991 | Jones |
| 5,489,558 A | 2/1996 | Moffatt |
| 5,599,754 A | 2/1997 | Maeda |
| 5,776,844 A | 7/1998 | Koch |
| 5,780,371 A | 7/1998 | Rifqi |
| 5,830,814 A | 11/1998 | Combes |
| 5,925,583 A | 7/1999 | Yoshii |
| 5,958,812 A | 9/1999 | Koch |
| 5,990,023 A | 11/1999 | Siedel |
| 6,087,284 A | 7/2000 | Brix |
| 6,150,028 A | 11/2000 | Mazon |
| 6,162,750 A | 12/2000 | Miwa |
| 6,313,052 B1 | 11/2001 | Nakashima |
| 6,335,300 B1 | 1/2002 | Bordeaux |
| 6,797,658 B2 | 9/2004 | Pecoraro |
| 6,878,652 B2 | 4/2005 | Pecoraro |
| 6,905,991 B1 | 6/2005 | El Khiati |
| 7,153,798 B2 | 12/2006 | Bordeaux |
| 7,273,668 B2 | 9/2007 | Kurachi |
| 7,557,053 B2 | 7/2009 | Thomsen |
| 7,772,144 B2 | 8/2010 | Landa |
| 7,893,350 B2 | 2/2011 | Thomsen |
| 8,377,834 B2 | 2/2013 | Nagai |
| 8,455,375 B2 | 6/2013 | Nishizawa et al. |
| 8,828,897 B2 | 9/2014 | Fechner |
| 8,895,463 B2 | 11/2014 | Kuroiwa |
| 8,921,245 B2 | 12/2014 | Nishizawa |
| 2002/0042068 A1 | 4/2002 | Mizuno |
| 2002/0065187 A1 | 5/2002 | Bordeaux |
| 2002/0074930 A1 | 6/2002 | Futagami |
| 2002/0147102 A1 | 10/2002 | Yamazaki |
| 2002/0169062 A1 | 11/2002 | Pecoraro |
| 2002/0193232 A1 | 12/2002 | Itoh |
| 2003/0054938 A1 | 3/2003 | Pecoraro |
| 2003/0220183 A1 | 11/2003 | Kurachi |
| 2003/0230112 A1 | 12/2003 | Ikeda |
| 2004/0142811 A1 | 7/2004 | Torr |
| 2005/0003136 A1 | 1/2005 | Kurachi |
| 2005/0028559 A1 | 2/2005 | Hiromatsu |
| 2005/0037912 A1 | 2/2005 | Ek Khiati |

(Continued)

FOREIGN PATENT DOCUMENTS

| | | |
|---|---|---|
| CN | 1712375 A | 12/2005 |
| CN | 1792919 A | 6/2006 |

(Continued)

OTHER PUBLICATIONS

Definition of Flake, American Heritage® Dictionary of the English Language, Fifth Edition. Copyright © 2016 by Houghton Mifflin Harcourt Publishing Company. Published by Houghton Mifflin Harcourt Publishing Company. (Year: 2016).*

*Primary Examiner* — Elizabeth A. Bolden

(74) *Attorney, Agent, or Firm* — Marshall & Melhorn, LLC

(57) ABSTRACT

Glasses are disclosed having a composition comprising the following oxides (in weight %): $SiO_2$ 61 to 70%, $Al_2O_3$ 0 to 9%, $Na_2O$ 10 to 13%, $K_2O$ 0 to 1%, MgO 2 to 6%, CaO 6 to 16%, SrO 0 to 1%, $ZrO_2$ 0 to 1%, $TiO_2$ 2 to 15%, the glasses having a strain point greater than 570° C. The glasses have good dimensional stability at high temperatures, making them suitable for fire protection glazings and substrates which are processed at elevated temperatures, e.g. substrates for display panels, information storage discs and semiconductor devices, including photovoltaic cells. Physical properties of the glasses, such as thermal expansion coefficient, density and refractive index, are disclosed, as are the melting and liquidus temperatures. The glasses are suitable for manufacture by the float process, yielding flat glass in the form of sheets.

18 Claims, No Drawings

(56) References Cited

U.S. PATENT DOCUMENTS

| | | |
|---|---|---|
| 2006/0068209 A1 | 3/2006 | Hirose |
| 2006/0073081 A1 | 4/2006 | Nomoto |
| 2006/0169316 A1 | 8/2006 | Thomsen |
| 2006/0182980 A1* | 8/2006 | Barton ............... B32B 17/10036 428/432 |
| 2006/0194687 A1 | 8/2006 | Seto |
| 2006/0216552 A1 | 9/2006 | Ikenishi |
| 2006/0217257 A1 | 9/2006 | Nagashima |
| 2007/0015653 A1 | 1/2007 | Lautenschlaeger |
| 2007/0032368 A1 | 2/2007 | Landa |
| 2007/0037686 A1 | 2/2007 | Goulas |
| 2007/0209698 A1 | 9/2007 | Thomsen |
| 2007/0215205 A1 | 9/2007 | Thomsen |
| 2008/0053152 A1 | 3/2008 | Kurachi |
| 2008/0096754 A1 | 4/2008 | Thomsen |
| 2008/0113857 A1 | 5/2008 | Lee |
| 2009/0103040 A1 | 4/2009 | Shimizu |
| 2009/0217978 A1 | 9/2009 | Thomsen |
| 2009/0253567 A1 | 10/2009 | Nagai |
| 2009/0297806 A1 | 12/2009 | Dawson-Elis |
| 2010/0040812 A1 | 2/2010 | Buckett |
| 2010/0089606 A1 | 4/2010 | Kwon |
| 2010/0300535 A1 | 12/2010 | Aitken |
| 2010/0304949 A1 | 12/2010 | Sachot |
| 2011/0135938 A1 | 6/2011 | Kim |
| 2012/0052275 A1 | 3/2012 | Hashimoto |
| 2012/0053044 A1 | 3/2012 | Lee |
| 2012/0132269 A1 | 5/2012 | Hickman |
| 2012/0141804 A1 | 6/2012 | Miyabe |
| 2012/0199203 A1 | 8/2012 | Nishizawa |
| 2012/0207995 A1* | 8/2012 | Shelestak ............... C03C 3/087 428/220 |
| 2013/0160845 A1 | 6/2013 | Kuroiwa |
| 2013/0164521 A1* | 6/2013 | Myoung ............... C03C 15/00 428/312.6 |
| 2013/0178355 A1 | 7/2013 | Nagai |
| 2013/0233386 A1 | 9/2013 | Hanawa |
| 2013/0306145 A1 | 11/2013 | Hanawa |
| 2013/0313671 A1 | 11/2013 | Cintora |
| 2014/0087935 A1 | 3/2014 | Muguruma |
| 2014/0209169 A1 | 7/2014 | Hanawa |
| 2014/0235425 A1 | 8/2014 | Nishizawa |
| 2014/0323286 A1 | 10/2014 | Gardiner |
| 2018/0099895 A1* | 4/2018 | Horsley ............... C03C 3/087 |
| 2018/0099896 A1* | 4/2018 | Horsley ............... C03C 3/087 |
| 2018/0099897 A1* | 4/2018 | Horsley ............... C03C 3/087 |

FOREIGN PATENT DOCUMENTS

| | | | |
|---|---|---|---|
| CN | 100366560 A | 6/2006 | |
| CN | 101239779 A | 8/2008 | |
| CN | 101462825 A | 6/2009 | |
| CN | 102718404 A * | 10/2012 | |
| CN | 102 718 404 B | 12/2014 | |
| EP | 734356 B1 | 10/1996 | |
| EP | 769481 A1 | 4/1997 | |
| EP | 2371775 A1 | 5/2011 | |
| EP | 2492247 A1 | 8/2012 | |
| EP | 2774895 A1 | 9/2014 | |
| JP | 61136936 A * | 6/1986 | ............ C03C 3/087 |
| JP | S61 136936 A | 6/1986 | |
| JP | 63147843 A * | 6/1988 | ............ C03C 3/091 |
| JP | S63 147843 A | 6/1988 | |
| JP | H05221683 A | 5/1993 | |
| JP | H08133771 A | 5/1996 | |
| JP | 3040933 U | 6/1997 | |
| JP | 10025129 A | 1/1998 | |
| JP | 10025130 A | 1/1998 | |
| JP | H10025128 A | 1/1998 | |
| JP | H11111342 A | 1/1999 | |
| JP | 11322358 A | 11/1999 | |
| JP | 2000143280 A | 5/2000 | |
| JP | 2000169177 A | 6/2000 | |
| JP | 2000169179 A | 6/2000 | |
| JP | 2000169180 A | 6/2000 | |
| JP | 2001026437 A | 1/2001 | |
| JP | 2002053340 A | 2/2002 | |
| JP | 2005330181 A | 2/2005 | |
| JP | 4158249 B2 | 7/2008 | |
| JP | 2008280189 A | 11/2008 | |
| JP | 2010-143790 A | 7/2010 | |
| JP | 20100143790 A | 7/2010 | |
| KR | 153457 B1 | 7/1998 | |
| KR | 2009111680 A | 10/2009 | |
| KR | 20090111680 A | 10/2009 | |
| KR | 2010080436 A | 7/2010 | |
| WO | 96-11888 A1 | 4/1996 | |
| WO | 9801400 A1 | 1/1998 | |
| WO | 98/49111 A1 | 11/1998 | |
| WO | WO-9849111 A1 * | 11/1998 | ............ C03C 3/087 |
| WO | 9901391 A1 | 1/1999 | |
| WO | 9926269 A1 | 5/1999 | |
| WO | 0216277 A1 | 2/2002 | |
| WO | 2008096876 A1 | 8/2008 | |
| WO | 2010023419 A | 3/2010 | |
| WO | 2011035889 A1 | 3/2011 | |
| WO | 2011069338 A1 | 6/2011 | |
| WO | 2013111749 A1 | 1/2013 | |
| WO | 2014/024850 A1 | 5/2013 | |
| WO | 2013099970 A1 | 7/2013 | |
| WO | 2013108790 A1 | 7/2013 | |
| WO | 2014038409 A1 | 7/2013 | |
| WO | 2013118897 A1 | 8/2013 | |
| WO | 2013133273 A1 | 12/2013 | |
| WO | 2014203481 A1 | 12/2014 | |
| ZA | 9805760 A | 7/1998 | |

* cited by examiner

GLASSES

BACKGROUND OF THE INVENTION

The present invention relates to glass, more specifically to novel glasses, novel glass compositions and to substrates composed of the novel glass compositions. The novel glass compositions are soda lime silica glasses, but possess relatively high strain points compared with known soda lime silica glasses, in particular those soda lime silica glasses which are in common use to produce flat glass by the float process. Consequently, the novel glasses of the invention are suited to applications requiring good dimensional stability at high temperatures, such as fire protection glazings and substrates for processing at high temperature. The substrates are suitable for the deposition of coatings and the manufacture of display panels, discs, e.g. magnetic recording discs, semiconductor devices, including photovoltaic cells, especially solar cells, amongst other applications.

While normal soda lime silica glass (i.e. soda lime silica glass compositions in common use for windows and other glazings for buildings and vehicles) has suitable properties at room temperature for many of the above applications, the applications may require processing of the glass at high temperatures, i.e. at temperatures which are above the strain point, or the annealing point, or even the softening point of the glass. Processing the glass at such elevated temperatures would result in the creation of permanent internal stresses in the glass, possibly leading to distortion or fracture of the glass. The glass may even become distorted or deformed during processing. Attempts have therefore been made to provide glasses which are more suited to high temperature processing, i.e. which possess improved high temperature stability by virtue of having relatively high strain points.

The strain point (which is defined as the temperature at which the viscosity of the glass is $10^{14.5}$ poise, denoted T log 14.5 poise) of soda lime float glass in common use is in the region of about 510° C. to 540° C., depending on the precise composition. However, many glasses with higher strain points are known. One group of glasses with high strain points is the so-called alkali-free glasses. Unfortunately, these glasses are difficult and expensive to produce, owing to the lack of alkali which acts as a flux. Many of these glasses are also unsuitable for forming by the float process. The use of alternative forming processes generally adds further to the cost, and may result in inferior flatness or smoothness of the surface. A further problem with alkali-free glasses is that they tend to have very low coefficients of thermal expansion, which renders them unsuitable for some applications.

Another group of glasses with relatively high strain points contains increased potash and reduced soda, compared with common or "normal" soda lime silica float glass.
$TiO_2$
Unfortunately, high potash glasses are themselves difficult to produce in the open regenerative furnaces generally employed in float plants, because high potash glasses may be difficult to refine in such furnaces.

A number of attempts have been made to provide a soda lime silica glass composition having a higher strain point than common float glass. U.S. Pat. No. 5,599,754 discloses a glass composition for a substrate, which is useful for flat display panels, particularly for plasma display panels. The claimed compositions contain from 6 to 9% SrO, which is expensive, and adds significantly to the cost of raw materials when used at these relatively high levels.

U.S. Pat. No. 6,905,991 is an example of a soda lime silica glass composition containing relatively low levels of soda (from 2 to 8% $Na_2O$) and relatively high levels of potash (from 0-8%, but all of the Examples contain at least 3.5% $K_2O$). The resulting glasses may be used for producing fireproof glazing panels or for substrates for display panels.

WO 98/49111 discloses a glass composition for a plasma display panel, the glass having a lower density than previous glasses for plasma display panels. The total amount of BaO and SrO included in the total alkaline earth metal oxides in the glass lies in the range of 1 to 8%. Again, these oxides are expensive.

U.S. Pat. No. 6,087,284 relates to an aluminosilicate glass which is suitable for use in display technology. This patent seeks to find a glass which has a high transition temperature, low density and is solarisation-stable. Preferably the glass contains MgO in trace levels at most, or not at all. It therefore represents a substantial departure from the composition of normal or common float glass.

U.S. Pat. No. 7,273,668 relates to a glass composition having high heat resistance which is suitable for chemical strengthening. The composition may be used to produce glass substrates for magnetic recording media, e.g. hard disk drives. Unfortunately this glass is prone to devitrification, which can make manufacturing difficult, and reduce yields.

KR 2009 0111680 A discloses a glass composition for display panels, which seeks to improve reactivity and failure rate of electrode patterns.

JP 2010 143790 A discloses a method for producing a glass substrate for a solar cell in which waste glass can be efficiently recycled. The waste glass is used as part of the glass raw material, which is then melted in a glass melting furnace and formed into the glass substrate.

U.S. Pat. No. 8,828,897 relates to aluminosilicate glasses having high thermal stability and low processing temperatures. The glasses may be used as substrate glass, superstrate glass and/or cover glass for photovoltaic applications and other solar technology applications.

U.S. Pat. No. 8,895,463 relates to a glass substrate for a solar cell such as a Cu—In—Ga—Se ("CIGS") solar cell. The glass compositions of the invention deviate significantly from common soda lime silica glass, being low in soda and high in potash.

US 2013/0306145 A1 also relates to a glass substrate for a CIGS solar cell, and again, the glass compositions are low in soda and high in potash.

US 2013/0313671 A1 relates to glass substrates for solar cells, such as CdTe or CIGS cells. It is stated that the content of SrO, BaO, $B_2O_3$ and/or $ZrO_2$ is advantageously zero in order not to penalize the cost of the glass sheet. However, judging by the Examples provided, this approach yields only modest increases in strain point compared with common soda lime silica glass.

SUMMARY OF THE INVENTION

It would be desirable to provide novel glasses which achieve a substantial increase in strain point without a substantial increase in the cost of the glass. The cost of glass comprises the cost of the raw materials together with the cost of converting them into finished glass sheets, which itself comprises elements such as the cost of fuel, labour, the plant employed, its level of efficiency, the yields obtained, etc. It would therefore further be desirable to provide novel glass compositions which achieve a substantial increase in strain point and are also able to be readily manufactured by the float process, since this process is a very efficient way of making flat glass. The desired novel glass compositions are therefore ones which lend themselves to economic manufacture.

It has surprisingly been found that the addition of $TiO_2$ to a normal float glass composition yields a substantial increase in the strain point of the glass.

According to the present invention there is provided a glass having a composition comprising the following oxides (in weight %):

| | |
|---|---|
| $SiO_2$ | 61 to 70% |
| $Al_2O_3$ | 0 to 9% |
| $Na_2O$ | 10 to 13% |
| $K_2O$ | 0 to 1% |
| MgO | 2 to 6% |
| CaO | 6 to 16% |
| SrO | 0 to 1% |
| $ZrO_2$ | 0 to 1% |
| $TiO_2$ | 2 to 15% | the glass having a strain point greater than 570° C.

DETAILED DESCRIPTION OF THE INVENTION

It has also been found that increasing the amount of $Al_2O_3$ in the glass composition, in addition to increasing the amount of $TiO_2$, further increases the strain point of the glass.

Glasses according to the invention are suitable for processing at higher temperatures than normal float glass. The inventive glasses are less susceptible to deformation or distortion at elevated temperatures, and so have higher dimensional stability and improved heat resistance.

Preferably, the glass comprises certain oxides in the following ranges (in weight %):

| | |
|---|---|
| $SiO_2$ | 61 to 69% |
| $Al_2O_3$ | 0 to 8% |
| CaO | 7 to 13% |
| $TiO_2$ | 2 to 13%. |

Advantageously, the glass comprises from 3 to 12% $TiO_2$, preferably from 3 to 11% $TiO_2$, more preferably from 4 to 10% $TiO_2$, still more preferably from 4 to 9% $TiO_2$, yet more preferably from 4 to 8% $TiO_2$, most preferably from 4 to 7% $TiO_2$. Particularly suitable glass compositions may contain from 4 to 6% $TiO_2$. Optionally, such glass compositions may also contain from 3 to 8% $Al_2O_3$, preferably from 4 to 7% $Al_2O_3$, more preferably from 5 to 6% $Al_2O_3$. Since titania ($TiO_2$) is more expensive than other raw materials employed in the manufacture of float glass, this allows glasses according to the invention to be tailored to achieve the desired balance between performance and cost.

Optionally, the glass is free of any one, or any number, of the following oxides: $As_2O_3$, BaO, $B_2O_3$, BeO, $CeO_2$, $Er_2O_3$, $GeO_2$, $Li_2O$, $P_2O_5$, PbO, $Sb_2O_3$, $SnO_2$, SrO, $V_2O_5$, ZnO, $ZrO_2$. These oxides may be objectionable for reasons of toxicity, cost or their adverse effect on the furnace structure. However, traces of these oxides may be present as a result of impurities in the raw materials. In particular, the glass composition may contain from 0 to 1% BaO or $B_2O_3$. In many of the applications contemplated, it is not necessary or not desirable to tint the glass, so in such cases the glass is free of colourants, e.g. CdO, $CeO_2$, CoO, $Co_3O_4$, $Cr_2O_3$, CuO, $Er_2O_3$, $MnO_2$, $Nd_2O_3$, NiO, Se, $V_2O_5$.

Preferably, a glass according to the invention has a strain point greater than 580° C., preferably greater than 585° C., more preferably greater than 590° C. As mentioned above, it is desirable to provide glasses which are readily manufactured by the float process. Therefore, while increasing the strain point of a glass, it is also important to take account of other properties of the glass, such as melting temperature, liquidus temperature and working range, which determine how readily the glass may be melted and formed. Surprisingly, the inventors were able to tailor all these properties simultaneously, to provide glasses with high strain points and favourable manufacturing properties.

Preferably, a glass according to the invention has a melting temperature (defined as the temperature at which the viscosity is 100 poise, i.e. log 2 poise, denoted T log 2 poise) less than 1500° C., preferably less than 1480° C., more preferably less than 1460° C. This allows the raw materials to be melted and turned into glass without excessive fuel usage and without causing undue wear to the structure of the furnace in which the glass is melted.

Advantageously, a glass according to the invention has a liquidus temperature less than 1200° C., preferably less than 1180° C., more preferably less than 1160° C., yet more preferably less than 1140° C., still more preferably less than 1120° C., most preferably less than 1100° C. A lower liquidus temperature reduces the risk of devitrification in molten glass in the cooler regions of the furnace. The term "devitrification" refers to the formation of crystals such as wollastonite (abbreviated to "Woll." in Table I below) or diopside in the glass, which is undesirable because such crystals may end up in the final product, causing it to be rejected.

Desirably, a glass according to the invention has a working range (defined as the forming temperature, i.e. T log 4 poise, minus the liquidus temperature) greater than −100° C., preferably greater than −80° C., more preferably greater than −60° C., yet more preferably greater than −40° C., still more preferably greater than −20° C., most preferably greater than 0° C., i.e. preferably the working range is positive. Some glass forming processes are more tolerant of a negative working range than others, and the float glass process is able to operate with a negative working range. A less negative, or more positive, working range facilitates forming of the molten glass into a product (e.g. a ribbon of flat glass) without devitrification occurring.

It is advantageous for the physical properties of the final product (e.g. sheet of glass, glass substrate, display panel, disc, etc) to be suited to the particular application for which the glass is intended. For some of these applications, normal soda lime silica glass possesses suitable physical properties at room temperature, but, as mentioned previously, it cannot be processed at sufficiently high temperatures without negative effects. According to an additional aspect of the invention, glasses are provided which not only have increased strain points, and lend themselves to economic manufacture, but also retain suitable physical properties at room temperature.

For instance, according to this aspect of the invention, a glass is provided having a coefficient of thermal expansion from 70 to $90 \times 10^{-7}$° $C.^{-1}$ (50-350° C.), preferably from 72 to $88 \times 10^{-7}$° $C.^{-1}$ (50-350° C.), more preferably from 74 to $86 \times 10^{-7}$° $C.^{-1}$ (50-350° C.), and most preferably from 76 to $84 \times 10^{-7}$° $C.^{-1}$ (50-350° C.).

Moreover, properties such as density and refractive index are also important when the glass produced by a furnace is changed over from one composition to another. A changeover of particular significance is the changeover from normal float glass to a glass according to the invention. Such changeovers are carried out "on the run", i.e. the mixture of raw materials fed to the furnace is changed to the mixture which is appropriate for the new composition without draining the furnace or stopping melting. The time taken for the changeover can be reduced if both glass compositions have similar density and refractive index, since mixing of the two compositions then occurs more readily.

It is therefore also desirable to provide a glass having a density from 2.50 to 2.70 g cm$^{-3}$ at 25° C., preferably from 2.51 to 2.69 g cm$^{-3}$ at 25° C., more preferably from 2.52 to 2.68 g cm$^{-3}$ at 25° C., further preferably from 2.53 to 2.67 g cm$^{-3}$ at 25° C., yet more preferably from 2.54 to 2.66 g cm$^{-3}$ at 25° C., most preferably from 2.55 to 2.66 g cm$^{-3}$ at 25° C.

Similarly, it is desirable if a glass according to the invention has a refractive index from 1.50 to 1.62, preferably from 1.51 to 1.60, more preferably from 1.52 to 1.59, more preferably from 1.53 to 1.58.

The invention also encompasses glass articles having a glass composition according to the appended claims, and in particular a sheet of glass formed from glass having a glass composition as claimed herein. Additionally, the invention includes a fire resistant glazing made with one or more sheets of such glass. Furthermore, the invention also includes a glass substrate comprising glass as claimed herein, and any of the products manufactured using such a glass substrate, including but not limited to a display panel, a disc, a semiconductor device and a photovoltaic cell, especially a solar cell. Glass substrates according to the invention may be used for CdTe and CIGS (Cu—In—Ga—Se) solar cells amongst others.

The invention will now be further described with reference to the following non-limiting Examples set out in Table 1. In the table, Examples 3 to 7 are according to the invention, and Examples 1, 2 and 8 to 20 are comparative examples. In particular, Example 1 is representative of normal float glass, and has a strain point of 536° C. In contrast, Examples 2 to 20 have strain points ranging from 574° C. to 595° C., and the Examples according to the invention span the same range of strain points.

It may be seen that Example 7 has the highest strain point, namely 595° C. This Example also has a very low melting temperature, namely 1290° C. In fact, this Example generally has relatively low viscosity at high temperature, including a forming temperature of only 972° C. Since the liquidus temperature of this glass is relatively high at 1171° C., this leads to a large negative working range of −199° C. Examples 5 and 6 concede only one or two degrees in terms of their strain points, and have working ranges of −91° C. and −108° C. respectively, which makes them better propositions from the manufacturing aspect.

Glasses having a glass composition according to the invention therefore offer a considerably increased strain point while retaining suitable manufacturing and room temperature properties, rendering it suitable for high temperature processing and other applications requiring increased dimensional stability at elevated temperatures.

TABLE 1

| Example Number | 1 | 2 | 3 | 4 | 5 | 6 | 7 |
|---|---|---|---|---|---|---|---|
| Composition (wt %) | | | | | | | |
| SiO2 | 72.8 | 69.7 | 64.2 | 61.5 | 66.6 | 65.4 | 62 |
| Na2O | 13.4 | 10 | 11.8 | 11.7 | 10.1 | 10.1 | 10.1 |
| CaO | 8.71 | 15.3 | 12.06 | 12.0 | 9.2 | 10.2 | 12.1 |
| MgO | 4.26 | 4.24 | 4.29 | 4.15 | 4.13 | 4.22 | 4.35 |
| Al2O3 | 0.4 | 0.4 | 0.11 | 7.06 | 5.03 | 4.12 | 0.08 |
| ZrO2 | | | | | | | |
| TiO2 | | | 7.2 | 3.1 | 4.6 | 5.5 | 10.8 |
| SrO | | | | | | | |
| BaO | | | | | | | |
| SO3 | 0.31 | 0.34 | 0.31 | 0.34 | 0.24 | 0.28 | 0.34 |
| Fe2O3 (Trace components) | 0.015 | 0.015 | 0.013 | 0.107 | 0.102 | 0.105 | 0.103 |
| K2O | 0.01 | 0.01 | 0.01 | 0.01 | 0.01 | 0.01 | 0.01 |
| Forming Characteristics | | | | | | | |
| Liquidus Temperature (° C.) | 1066 | 1201 | 1116 | 1157 | 1158 | 1154 | 1171 |
| Working Range (liquidus minus T log 4) | −39 | −179 | −143 | −135 | −91 | −108 | −199 |
| Primary Devitrification Phase | Woll. | Woll. | Woll. | Woll. | Woll. | Woll. | Woll. |
| Physical Properties | | | | | | | |
| Coeff. of Thermal Expansion (50°-350° C.) | 87.1 | 84.9 | 89.0 | 86.4 | 76.2 | 77.9 | 83.1 |
| Young's modulus E (GNm-2) | 74.8 | 79.9 | 84.1 | 80.8 | 79.2 | 80.8 | 84.5 |
| Shear Modulus G (GNm-2) | 30.5 | 32.5 | 33.8 | 32.9 | 32.5 | 33.3 | 34.3 |
| Poisson's Ratio σ | 0.23 | 0.23 | 0.25 | 0.23 | 0.22 | 0.21 | 0.23 |
| Density (g/cm3 @ 25° C.) | 2.495 | 2.563 | 2.619 | 2.594 | 2.551 | 2.572 | 2.661 |
| Refractive Index (Nad) | 1.5182 | 1.5388 | 1.5688 | 1.5492 | 1.5441 | 1.5517 | 1.589 |
| Viscosity Profile (° C.) | | | | | | | |
| T log 2 poise (Melting Temperature) | 1448 | 1389 | 1309 | 1389 | 1476 | 1431 | 1290 |
| T log 2.5 poise | 1304 | 1265 | 1195 | 1264 | 1336 | 1300 | 1182 |
| T log 3 poise | 1191 | 1167 | 1105 | 1165 | 1227 | 1197 | 1097 |
| T log 4 poise (Forming Temperature) | 1027 | 1021 | 973 | 1021 | 1067 | 1046 | 972 |
| T log 5 poise | 912 | 919 | 881 | 921 | 957 | 941 | 885 |
| T log 7.6 poise (Softening Point) | 732 | 755 | 734 | 762 | 782 | 775 | 747 |
| T log 13 poise (Annealing Point) | 563 | 600 | 596 | 613 | 619 | 619 | 616 |
| T log 13.4 poise | 555 | 592 | 589 | 606 | 611 | 612 | 610 |
| T log 14.5 poise (Strain Point) | 536 | 575 | 574 | 589 | 593 | 594 | 595 |

TABLE 1-continued

| Example Number | 8 | 9 | 10 | 11 | 12 | 13 | 14 |
|---|---|---|---|---|---|---|---|
| Composition (wt %) | | | | | | | |
| SiO2 | 68.0 | 68.7 | 69.1 | 66.2 | 64.8 | 67.7 | 67.0 |
| Na2O | 11.7 | 12 | 12.3 | 10.9 | 11.8 | 11.9 | 11.5 |
| CaO | 9.86 | 8.52 | 7.24 | 6.23 | 11.9 | 6.51 | 11.5 |
| MgO | 4.43 | 4.52 | 4.62 | 4.21 | 4.24 | 4.42 | 4.40 |
| Al2O3 | 3.47 | 1.88 | 0.28 | 0.08 | 0.03 | 0.08 | 5.20 |
| ZrO2 | 2.14 | 4.06 | 6.1 | 6.8 | | | |
| TiO2 | | | | | 6.8 | 8.8 | |
| SrO | | | | 5.0 | | | |
| BaO | | | | | | | |
| SO3 | 0.22 | 0.21 | 0.185 | 0.29 | 0.31 | 0.24 | 0.26 |
| Fe2O3 (Trace components) | 0.075 | 0.075 | 0.077 | 0.058 | 0.015 | 0.104 | 0.075 |
| K2O | 0.01 | 0.01 | 0.01 | 0.02 | 0.01 | 0.02 | 0.02 |
| Forming Characteristics | | | | | | | |
| Liquidus Temperature (° C.) | 1148 | 1129 | 1079 | 1030 | 1149 | 1075 | 1164 |
| Working Range (liquidus minus T log 4) | −84 | −46 | 14 | 57 | −105 | 44 | −110 |
| Primary Devitrification Phase | | Diopside | Diopside | Woll. | Woll. | Woll. | |
| Physical Properties | | | | | | | |
| Coeff. of Thermal Expansion (50°-350° C.) | 81.8 | 80.9 | 79.9 | 78.7 | 84.2 | 76.8 | 84.7 |
| Young's modulus E (GNm-2) | 78.3 | 79.3 | 78.1 | 80.4 | 82.8 | 80 | 78 |
| Shear Modulus G (GNm-2) | 32.1 | 32.4 | 32.2 | 33.3 | 33.6 | 33.7 | 32.1 |
| Poisson's Ratio σ | 0.22 | 0.22 | 0.21 | 0.21 | 0.23 | 0.19 | 0.22 |
| Density (g/cm3 @ 25° C.) | 2.554 | 2.568 | 2.581 | 2.668 | 2.664 | 2.620 | 2.541 |
| Refractive Index (Nad) | 1.5322 | 1.5347 | 1.5361 | 1.5452 | 1.5544 | 1.5436 | 1.5298 |
| Viscosity Profile (° C.) | | | | | | | |
| T log 2 poise (Melting Temperature) | 1456 | 1472 | 1478 | 1453 | 1380 | 1482 | 1452 |
| T log 2.5 poise | 1324 | 1343 | 1352 | 1334 | 1269 | 1365 | 1317 |
| T log 3 poise | 1219 | 1239 | 1249 | 1237 | 1180 | 1268 | 1211 |
| T log 4 poise (Forming Temperature) | 1064 | 1082 | 1093 | 1087 | 1043 | 1118 | 1054 |
| T log 5 poise | 953 | 970 | 980 | 977 | 944 | 1007 | 944 |
| T log 7.6 poise (Softening Point) | 775 | 786 | 793 | 794 | 781 | 818 | 769 |
| T log 13 poise (Annealing Point) | 605 | 607 | 608 | 609 | 619 | 626 | 602 |
| T log 13.4 poise | 597 | 598 | 599 | 600 | 611 | 617 | 594 |
| T log 14.5 poise (Strain Point) | 577 | 577 | 577 | 579 | 592 | 594 | 575 |

| Example Number | 15 | 16 | 17 | 18 | 19 | 20 |
|---|---|---|---|---|---|---|
| Composition (wt %) | | | | | | |
| SiO2 | 65.8 | 67.7 | 63.9 | 64.0 | 64.8 | 63.3 |
| Na2O | 11.6 | 11.6 | 11.3 | 11.3 | 10.8 | 11.5 |
| CaO | 11.61 | 11.88 | 12.1 | 10.9 | 12.6 | 7.5 |
| MgO | 4.21 | 2.05 | 4.14 | 5.27 | 4.3 | 4.86 |
| Al2O3 | 6.35 | 6.41 | 8.03 | 8.00 | 7.06 | 8.0 |
| ZrO2 | | | | | | |
| TiO2 | | | | | | |
| SrO | | | | | | 4.3 |
| BaO | | | | | | |
| SO3 | 0.27 | 0.22 | 0.33 | 0.33 | 0.28 | 0.27 |
| Fe2O3 (Trace components) | 0.014 | 0.012 | 0.105 | 0.105 | 0.107 | 0.107 |
| K2O | 0.06 | 0.06 | 0.01 | 0.01 | 0.01 | 0.02 |
| Forming Characteristics | | | | | | |
| Liquidus Temperature (° C.) | 1168 | 1174 | 1178 | 1209 | 1173 | 1140 |
| Working Range (liquidus minus T log 4) | −118 | −107 | −116 | −140 | −109 | −69 |
| Primary Devitrification Phase | Woll. | Woll. | Diopside | Diopside | Diopside | |
| Physical Properties | | | | | | |
| Coeff. of Thermal Expansion (50°-350° C.) | 85.2 | 84.8 | 84.1 | 83.4 | 82.9 | 83.9 |
| Young's modulus E (GNm-2) | 79.8 | 77.2 | 78.9 | 79.1 | 79.7 | 78.7 |
| Shear Modulus G (GNm-2) | 32.8 | 31.5 | 32.8 | 32.4 | 32.6 | 32 |
| Poisson's Ratio σ | 0.22 | 0.22 | 0.20 | 0.22 | 0.23 | 0.23 |
| Density (g/cm3 @ 25° C.) | 2.5478 | 2.5225 | 2.556 | 2.550 | 2.556 | 2.582 |
| Refractive Index (Nad) | 1.5311 | 1.5268 | 1.5321 | 1.5317 | 1.5325 | 1.5294 |
| Viscosity Profile (° C.) | | | | | | |
| T log 2 poise (Melting Temperature) | 1444 | 1495 | 1451 | 1462 | 1452 | 1472 |
| T log 2.5 poise | 1310 | 1347 | 1320 | 1329 | 1321 | 1337 |
| T log 3 poise | 1204 | 1233 | 1216 | 1224 | 1217 | 1230 |
| T log 4 poise (Forming Temperature) | 1049 | 1066 | 1062 | 1068 | 1064 | 1071 |
| T log 5 poise | 940 | 952 | 953 | 959 | 955 | 958 |
| T log 7.6 poise (Softening Point) | 768 | 772 | 780 | 783 | 782 | 776 |

TABLE 1-continued

| | | | | | | |
|---|---|---|---|---|---|---|
| T log 13 poise (Annealing Point) | 604 | 605 | 615 | 616 | 617 | 602 |
| T log 13.4 poise | 597 | 598 | 607 | 608 | 609 | 594 |
| T log 14.5 poise (Strain Point) | 578 | 579 | 588 | 589 | 590 | 574 |

The invention claimed is:

1. A soda lime silica glass having a strain point greater than 570° C., comprising the following oxides (in weight %):

| | |
|---|---|
| $SiO_2$ | 61 to 69% |
| $Al_2O_3$ | 3 to 8% |
| $Na_2O$ | 10 to 13% |
| $K_2O$ | 0 to 1% |
| MgO | 2 to 6% |
| CaO | 7 to 13% |
| SrO | 0 to 1% |
| $ZrO_2$ | 0 to 1% |
| $TiO_2$ | 3 to 12% |
| $B_2O_3$ | 0 to 1%. |

2. The glass as claimed in claim 1, comprising from 3 to 11% $TiO_2$.

3. The glass as claimed in claim 1, comprising from 4 to 10% $TiO_2$.

4. The glass as claimed in claim 1, comprising from 4 to 6% $TiO_2$.

5. The glass as claimed in claim 1 having a strain point greater than 580° C.

6. The glass as claimed in claim 1 having a melting temperature (at which viscosity=log 2 poise) less than 1500° C.

7. The glass as claimed in claim 1 having a liquidus temperature less than 1200° C.

8. The glass as claimed in claim 1 having a working range (defined as T log 4 poise minus the liquidus temperature) greater than −100° C.

9. The glass as claimed in claim 1 having a coefficient of thermal expansion from 70 to 90×$10^{-7}$° $C.^{-1}$ (50-350° C.).

10. The glass as claimed in claim 1 having a density from 2.50 to 2.70 g $cm^{-3}$ at 25° C.

11. The glass as claimed in claim 1 having a refractive index from 1.50 to 1.62.

12. A sheet of glass formed from glass as claimed in claim 1.

13. A glass substrate comprising glass as claimed in claim 1.

14. A photovoltaic cell comprising the glass substrate of claim 13.

15. A flat glass produced by an on-line float glass process, having a strain point greater than 570° C., comprising the following oxides (in weight %):

| | |
|---|---|
| $SiO_2$ | 61 to 69% |
| $Al_2O_3$ | 3 to 8% |
| $Na_2O$ | 10 to 13% |
| $K_2O$ | 0 to 1% |
| MgO | 2 to 6% |
| CaO | 7 to 13% |
| SrO | 0 to 1% |
| $ZrO_2$ | 0 to 1% |
| $TiO_2$ | 3 to 12%. |

16. A glass substrate for a photovoltaic cell comprising the flat glass as claimed in claim 15.

17. A flat glass substrate having a strain point greater than 570° C., comprising the following oxides (in weight %):

| | |
|---|---|
| $SiO_2$ | 61 to 69% |
| $Al_2O_3$ | 0 to 8% |
| $Na_2O$ | 10 to 13% |
| $K_2O$ | 0 to 1% |
| MgO | 2 to 6% |
| CaO | 9.2 to 13% |
| SrO | 0 to 1% |
| $ZrO_2$ | 0 to 1% |
| $TiO_2$ | 3 to 13% |
| $B_2O_3$ | 0 to 1%. |

18. A photovoltaic cell comprising the flat glass substrate of claim 17.

* * * * *